(12) United States Patent
Hatada et al.

(10) Patent No.: US 6,429,454 B2
(45) Date of Patent: Aug. 6, 2002

(54) SEMICONDUCTOR DEVICE WITH TEST CIRCUIT

(75) Inventors: Hiroshi Hatada, Yokohama; Nobuaki Otsuka, Komae; Osamu Hirabayashi, Hiratsuka; Yasushi Kameda, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/877,788

(22) Filed: Jun. 11, 2001

(30) Foreign Application Priority Data

Jun. 12, 2000 (JP) .......................................... 2000-175484

(51) Int. Cl.[7] .......................... A01L 23/58; A01L 23/48; A01L 23/52; A01L 29/40
(52) U.S. Cl. .......................................... 257/48; 257/786
(58) Field of Search .............................. 438/14, 15, 17, 438/18; 257/48, 786

(56) References Cited

U.S. PATENT DOCUMENTS 5,386,127 A * 1/1995 Furuyama ..................... 257/48
5,965,903 A * 10/1999 Chittipeddi et al. ........... 257/48
6,121,677 A * 9/2000 Song et al. .................... 257/48
6,291,835 B1 * 9/2001 Tsuji et al. .................... 257/48

OTHER PUBLICATIONS

IEEE Standard Test Access Port and Boundary–Scan Architecture, 1149.1, Chapter 1, Feb. 15, 1990.

* cited by examiner

Primary Examiner—David E. Graybill
(74) Attorney, Agent, or Firm—Banner & Witcoff, Ltd.

(57) ABSTRACT

A semiconductor device has pads that are arranged in such a manner as to easily accept manual needles to carry out a test. This technique is applicable to carry out a test with use of a boundary scan test circuit in synchronization with a cycle time defined by a normal operation clock signal. The semiconductor device has a first pad connected to a first one of registers that form a serial scan chain, to supply test data to the registers, a second pad connected to a last one of the registers, and a third pad to supply a test clock signal to the registers. The registers are arranged in a central part of the semiconductor device, and the first to third pads are arranged at the periphery of the semiconductor device.

18 Claims, 7 Drawing Sheets

SEMICONDUCTOR DEVICE WITH TEST CIRCUIT

CROSS REFERENCE TO RELATED APPLICATIONS

This application claims benefit of priority under 35 USC 119 based on Japanese Patent Application No. P2000-175484 filed on Jun. 12, 2000, the entire contents of which are incorporated by reference herein.

BACKGROUND OF THE INVENTION

1. Field of the Invention

The present invention relates to a semiconductor device with a test circuit and pads that are arranged to easily carry out a test such as a defects analyzing test, and a semiconductor device capable of carrying out a test at intervals of a cycle time set for a semiconductor chip.

2. Description of Related Art

FIG. 1 is a block diagram showing pads arranged on a semiconductor chip in a semiconductor device. The pads and are arranged in a middle part of the chip 102 in order to improve circuit performance. In FIG. 1, the pads are input/output (I/O) pads 40 and are connected to probe-card needles or bonding wires 51, respectively.

To carry out a test such as a defects analyzing test on the semiconductor device, a probe card, for example, is used. The probe card has probe-card needles 51, which are extended to the pads 40 arranged in the middle part of the chip 102. As a result, the surface of the chip 102 is covered with the needles 51, to greatly reduce a space for accepting manual needles for the test, thereby hindering in the test of the defects analyzing.

Since the pads 40 are in the middle part of the chip 102, the arrangement of FIG. 1 needs longer bonding wires than a chip that arranges pads along the periphery thereof. The long bonding wires cause signal skew, and narrow gaps among the pads 40 hardly receive the bonding wires.

A circuit board provided with several semiconductor chips frequently employs a boundary scan test circuit for testing wiring shorts or opens. The boundary scan test circuit is configured to test the board at low test frequencies, and therefore, is unable to operate at intervals of a cycle time set for the semiconductor chips installed on the board. Pads formed on these chips are provided with cells such as registers to form a boundary scan chain serving as a test path. To set test data in each pad, the test data must serially be transferred to the pads in synchronization with a test clock signal (TCK), and therefore, setting the test data in all pads needs test clock signal periods whose number is equal to the number of the pads. The test clock signal (TCK) is slower than a clock signal (CK) for semiconductor device operation, and therefore, the boundary scan test circuit is unusable to test logic circuits, etc., that are contained in semiconductor devices on the chip and operate at the clock signal (CK).

SUMMARY OF THE INVENTION

The present invention is to provide a semiconductor device capable of easily accepting manual needles and bonding wires to carry out a test such as a defects analyzing test with the use of, for example, a probe card.

The present invention is further to provide a semiconductor device capable of utilizing a boundary scan test circuit, to test internal circuits such as logic circuits in the semiconductor device according to a clock signal used for device operation.

A semiconductor device according to this invention includes a plurality of input/output pads arranged in a middle part of the semiconductor device, a plurality of registers provided for the input/output pads, respectively, and connected to one another in series to form a serial scan chain, a first pad arranged at the periphery of the semiconductor device and connected to a first one of the registers formed the serial scan chain, the first pad configured to receive externally supplied test data and supply the test data to the registers, a second pad arranged at the periphery of the semiconductor device and connected to a last one of the registers formed the serial scan chain, and a third pad arranged at the periphery of the semiconductor device, the third pad configured to supply an externally supplied first clock signal to the registers.

DESCRIPTION OF THE EMBODIMENTS

Figure 1:
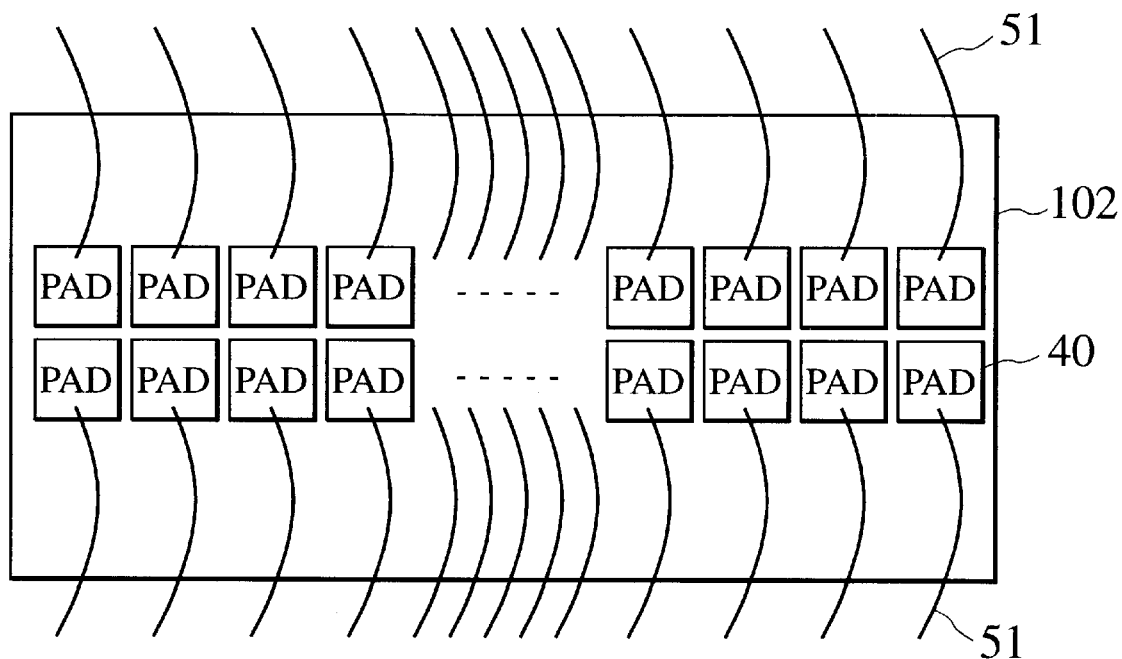
FIG. 1 is a block diagram showing a semiconductor device according to a related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2:
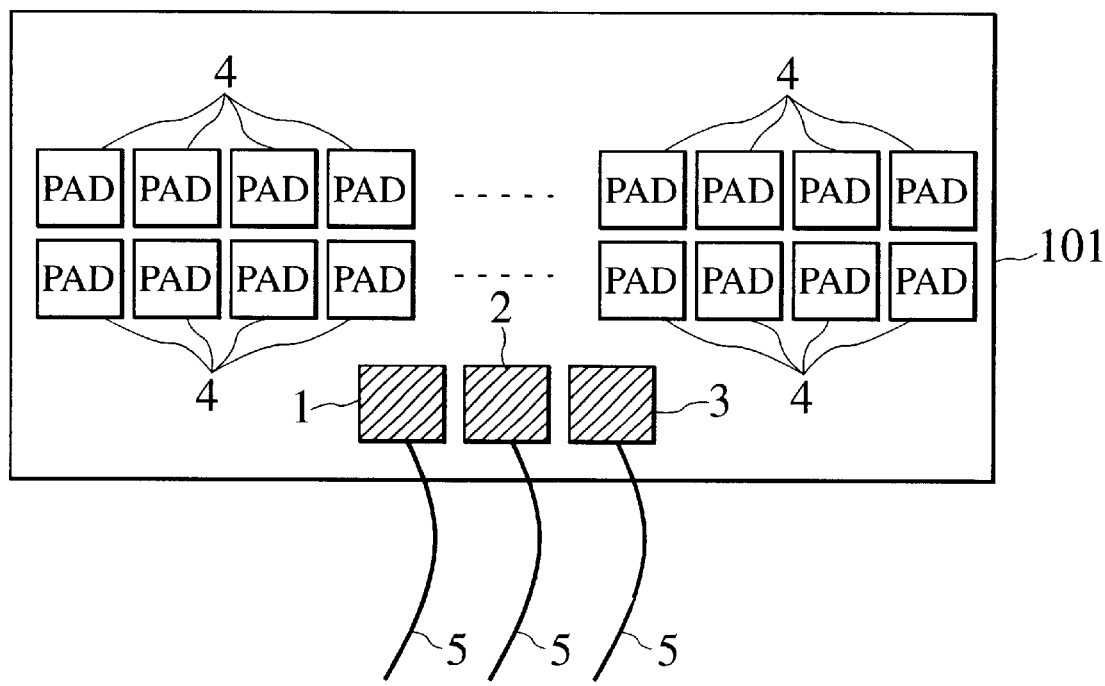
FIG. 2 is a block diagram showing a semiconductor device according to a first embodiment of the present invention.

FIG. 2 is a block diagram showing a semiconductor device having I/O pads according to the first embodiment of the present invention. The semiconductor device is formed on a semiconductor chip 101. At the periphery of the chip 101, a test data input pad 1, a test data output pad 2, and a test clock signal (TCK) input pad 3 are formed. The pads 1 to 3 are connected to wires 5 used for a test such as a defects analyzing test. The wires 5 may be probe-card needles, bonding wires, etc. The I/O pads 4 are in a middle part of the chip 101.

An external tester (not shown) provides test data, which is serially set in the pads 4 through the test data input pad 1. After carrying out a predetermined test, the pads 4 provide resultant data, which is passed through a serial scan chain serving as a data path and is transferred to the external tester through the test data output pad 2. A test clock signal (TCK) used to transfer the test data is supplied from the external tester to the test clock signal input pad 3 and to registers that are provided for the pads 4, respectively. FIG. 2 conceptually shows arrangements of the pads 1 to 4 and does not show the registers provided for the pads 4 to form the serial scan chain.

Figure 3:
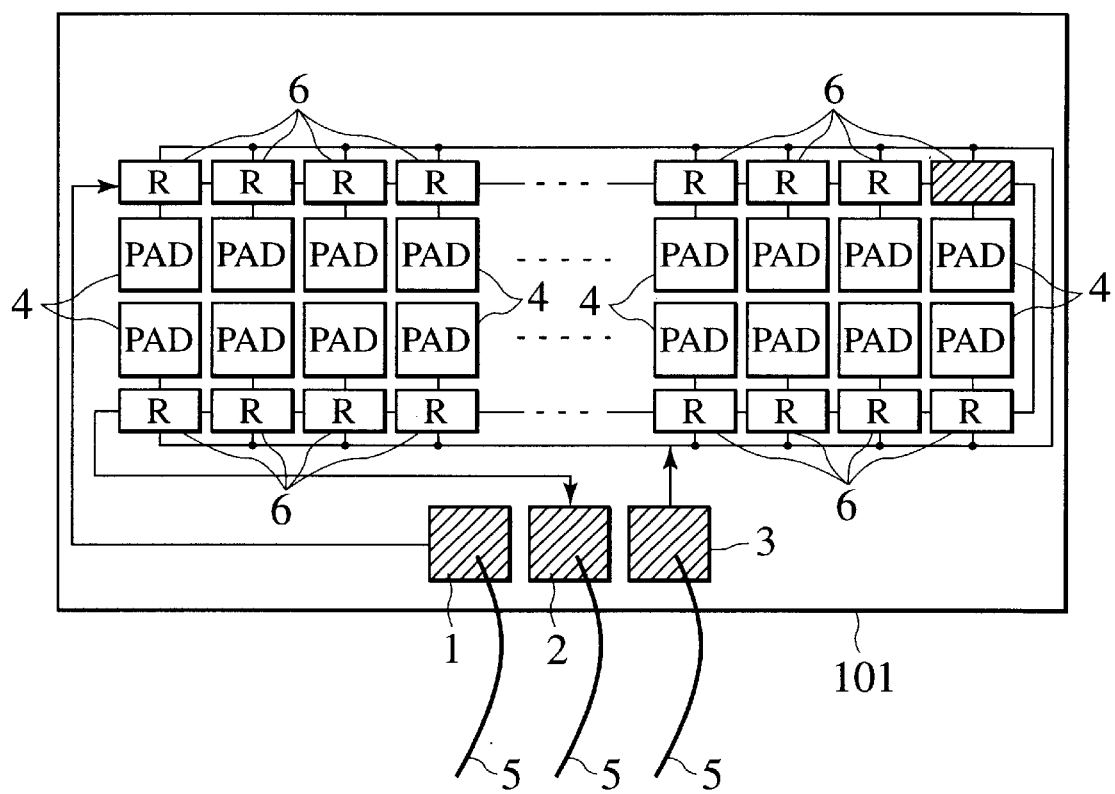
FIG. 3 is a block diagram showing the details of FIG. 2.

FIG. 3 shows the details of the pads 1 to 4 and registers 6 mentioned above. The registers 6 are provided for the pads 4, respectively, and form the serial scan chain serving as a data path. The registers 6 operate in synchronization with the test clock signal (TCK) supplied through the test clock signal input pad 3. Namely, the serial scan chain involving the test data input pad 1, registers 6, and test data output pad 2 is used to set test data supplied from the external tester (not shown) into the registers 6 in synchronization with the test clock signal (TCK).

The first embodiment arranges the pads 1 to 3 at the periphery of the chip 101, so that probe-card needles or bonding wires may easily be connected only to the pads 1 to 3 when setting test data into the I/O pads 4 arranged in the middle part of the chip 101. This arrangement enables a test such as a defects analyzing test to be carried out easily.

The present invention is applicable to a semiconductor chip having a JTAG boundary scan test circuit. This will be explained. The test data input pad 1, test data output pad 2, and test clock signal input pad 3 of FIGS. 2 and 3 are assigned to TDI, TDO, and TCK pads of the JTAG boundary scan test circuit, so that the pads 1 to 3 of FIGS. 2 and 3 may not additionally be formed on a semiconductor chip having the JTAG boundary scan test circuit.

The registers 6 of FIG. 3 forming a boundary scan chain may be assigned to a JTAG test data register circuit, to save a layout area of the semiconductor chip having the JTAG boundary scan test circuit. Arranging the pads 1, 2, and 3 for a boundary scan test circuit in a middle part of a semiconductor chip may increase a CR delay compared to arranging them at the periphery of the semiconductor chip. A boundary scan chain in the boundary scan test circuit is originally a test path that needs no high-speed operation, so that the pads 1, 2, and 3 may be arranged in the middle part without deteriorating the performance of the boundary scan test circuit.

Figure 4:
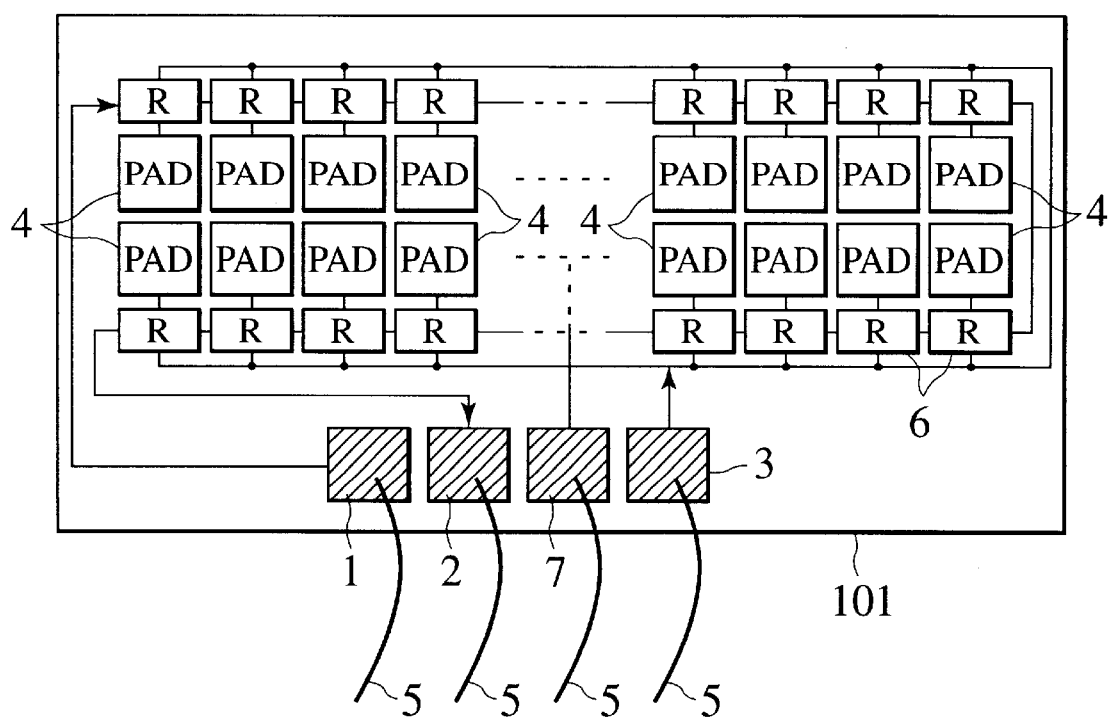
FIG. 4 is a block diagram showing a semiconductor device according to a modification of the first embodiment.

In a defects analyzing test of a semiconductor chip, there is a requirement to directly input test data such as a test vector from a dedicated pad into a tested part by bypassing the test data input pad 1 and boundary scan chain. FIG. 4 is a block diagram showing a semiconductor device having such a dedicated pad 7 according to a modification of the first embodiment. The dedicated pad 7 is formed at the periphery of a semiconductor chip 101 and is used to directly input test data by bypassing a test data input pad 1 or a boundary scan chain. Probe-card needles or bonding wires may easily be connected only to the pads 1, 2, 3, and 7 to set test data necessary for carrying out a defects analyzing test.

Figure 5:
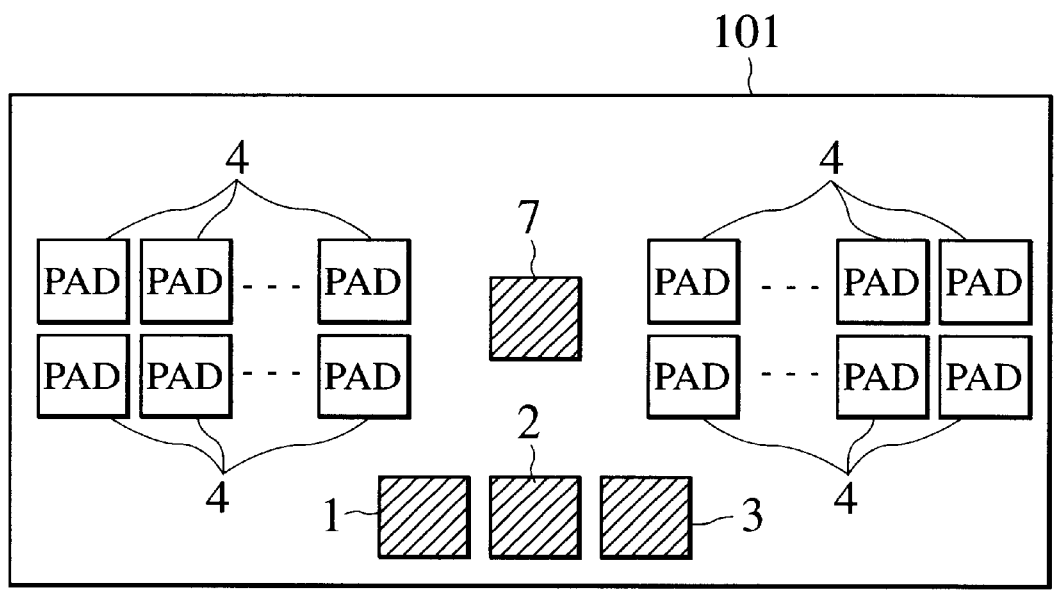
FIG. 5 is a block diagram showing a semiconductor device according to another modification of the first embodiment.

FIG. 5 is a block diagram showing a semiconductor device according to another modification of the first embodiment. The semiconductor devices may have circuit characteristics that must consider the influence of CR delay and clock skew. Accordingly, a dedicated pad 7 is arranged at the center of a semiconductor chip 101 with each gap between the pad 7 and any adjacent (I/O pad 4 being widened. For example, the gap must be extended to easily receive a probe-card needle or a bonding wire. The arrangement of the dedicated pad 7 of FIG. 5 is effective to reduce clock skew. For the sake of simplicity of explanation, FIG. 5 does not show the probe-card needles or bonding wires 5, the registers 6 to form a boundary scan chain, and other wires of FIG. 4. When a plurality of dedicated pads 7 are formed in a central part of a semiconductor chip, it is preferable not to arrange them side by side.

Figure 6:
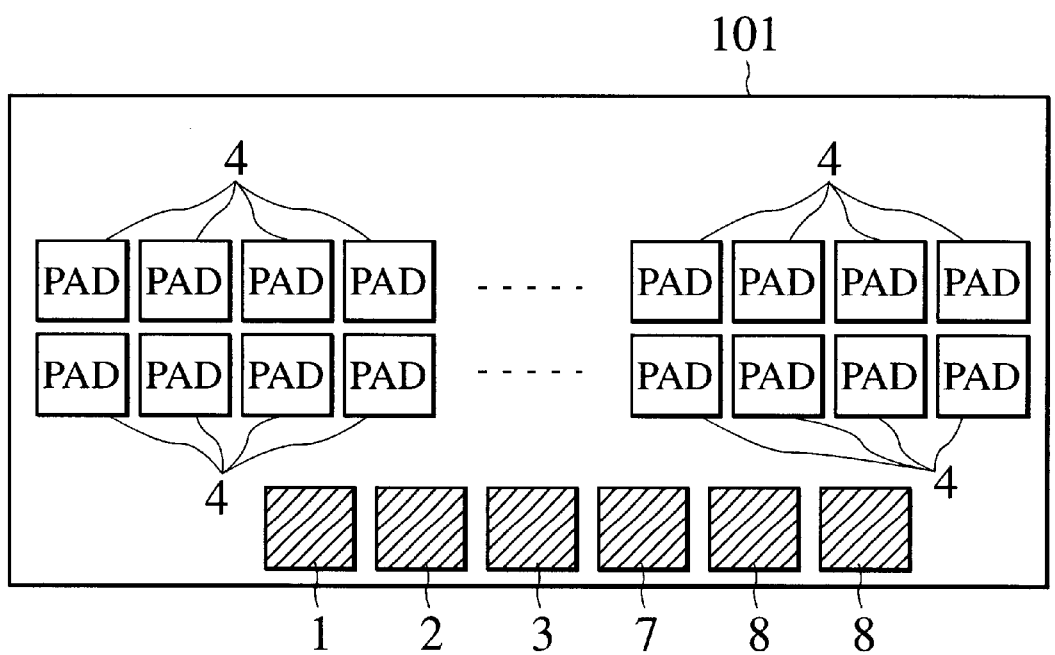
FIG. 6 is a block diagram showing a semiconductor device according to still another modification of the first embodiment.

FIG. 6 is a block diagram showing a semiconductor device according to still another modification of the first embodiment. This modification arranges power source pads 8 at the periphery of a semiconductor chip 101, like the pads 1 to 3 of FIGS. 2 and 3. Similar to FIG. 5, FIG. 6 omits the probe-card needles or bonding wires 5, the registers 6 to form a boundary scan chain, and other wires of FIG. 4 for the sake of simplicity of explanation.

Figure 7:
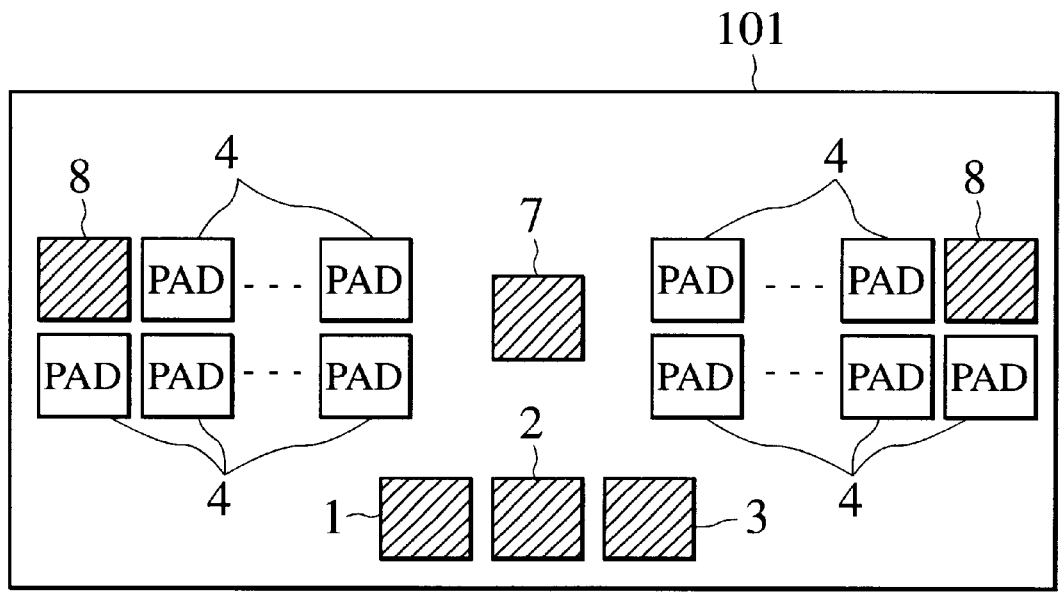
FIG. 7 is a block diagram showing a semiconductor device according to still another modification of the first embodiment.

FIG. 7 is a block diagram showing a semiconductor device according to still another modification of the first embodiment. This modification forms a plurality of power source pads 8 in a middle part of a semiconductor chip 101. The power source pads 8 are arranged such that they are not adjacent to one another and such that a gap between any power source pads 8 and any adjacent I/O pad 4 is sufficiently wide to easily receive a probe-card needle, etc. Furthermore, it is preferable that a gap between the power source pad 8 and any adjacent one of the I/O pads 4 is wider than a gap between adjacent ones of the I/O pads 4. Similar to FIGS. 5 and 6, FIG. 7 omits the probe-card needles or bonding wires 5, the registers 6 to form a boundary scan chain, and other wires of FIG. 4 for the sake of simplicity of explanation.

This modification secures, on a semiconductor chip, sufficient spaces for receiving manual needles even if the pads to receive probe-card needles or bonding wires are arranged at the center of the semiconductor chip. Also, this modification secures sufficient intervals among bonding wires, so that the bonding wires may easily be connected to carry out a test such as a defects analyzing test.

Second Embodiment

Figure 8:
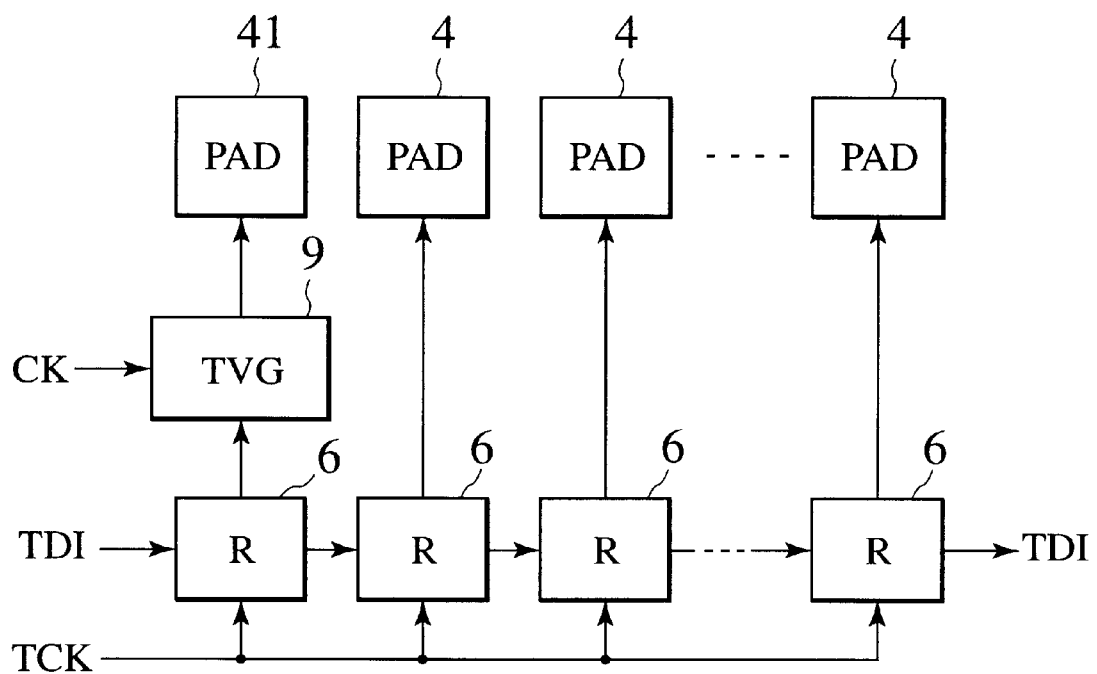
FIG. 8 is a block diagram showing a semiconductor device according to a second embodiment of the present invention.

FIG. 8 is a block diagram showing a semiconductor device according to the second embodiment of the present invention. In FIG. 8, registers 6 and pads 4 and 41 correspond to the registers 6 forming a boundary scan chain and the pads 4 of FIG. 4. The pad 41 is a pad for which a test vector must be set according to a clock signal (CK) of a normal operation cycle time. A test vector generator 9 operating with the clock signal (CK) is arranged between the register 6 and the pad 41. The pads 4 are usual test pads having the registers 6, respectively. For the sake of simplicity of explanation, FIG. 8 shows only the pads 4 and 41 for receiving test data. For example, pads for providing test result data sent from internal circuits (not shown) to the outside are not shown in FIG. 8.

To set test data TDI in the pads 4 and 41 to carry out, for example, a defects analyzing test, an external tester (not shown) serially transfers the test data to the registers 6 of the pads in synchronization with a test clock signal (TCK). The registers 6 form a boundary scan chain serving as a data path. The test data is supplied to the pads 4 and test vector generator 9 through the boundary scan chain. The number of test clock signal periods required to set the test data in all pads 4 and test vector generator 9 is equal to the number of the pads and test vector generator.

In this way, a first step of the defects analyzing test sets initial test values in the registers 6, pads 4, and test vector generator 9 in synchronization with the test clock signal (TCK). In a second step of the test, the test vector generator 9 sets test data having a predetermined vector value in the pad 41 according to the clock signal (CK) used for usual operation. In this way, the second embodiment is capable of using a boundary scan test circuit to set a test vector in the pad 41 according to a cycle time defined by the normal operation clock signal (CK) and executing a test such as a defects analyzing test.

Third Embodiment

Figure 9:
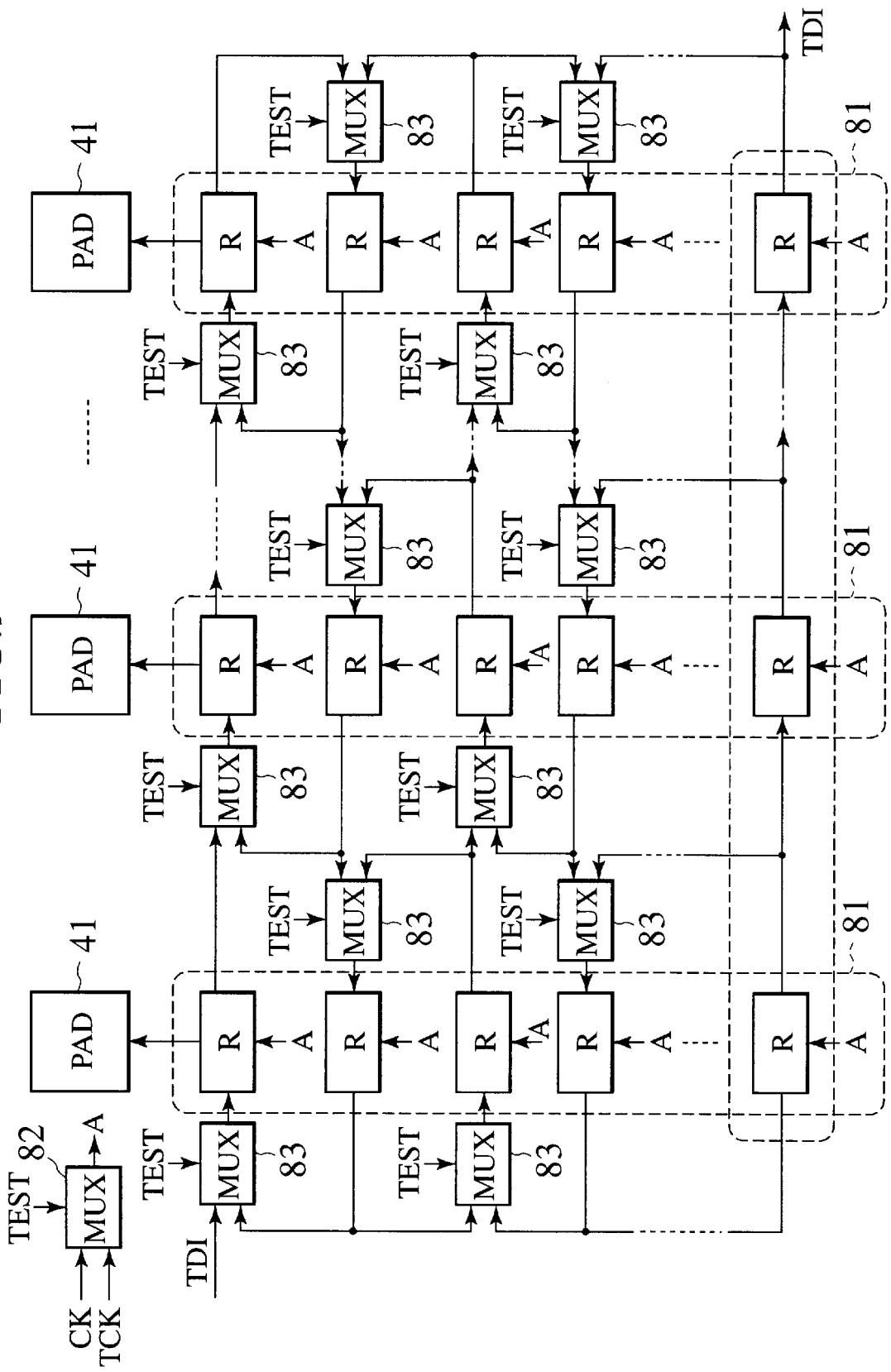
FIG. 9 is a block diagram showing a semiconductor device according to a third embodiment of the present invention.

FIG. 9 is a block diagram showing a semiconductor device according to the third embodiment of the present invention. Each pad 41 is provided with a register group 81 containing "m" registers to supply a plurality of test vectors to the pad 41. The example of FIG. 9 has "n" pads 41 (n being a positive integer). If there are "m" test vectors, a matrix of "n×m" registers form a register circuit. In this case, the register circuit contains n register groups 81 each containing m registers. The register groups 81 correspond to the pads 41, respectively.

To set initial test data (TDI) in all registers of the register circuit, a multiplexer (MUX) 82 selects a test clock signal (TCK) according to a control signal TEST and supplies the selected test clock signal as a control signal A to the registers of each register group 81.

According to the control signal TEST, each multiplexer 83 receives the test data (TDI) from an external tester (not shown) and sequentially transfers the test data to the registers. In the register circuit of FIG. 9, the test data (TDI) is serially transferred in synchronization with the control signal A to the n registers in the first (top) row of the register circuit from the leftmost column toward the rightmost column. The registers in the first row are directly connected to the pads 41, respectively. Thereafter, the test data is serially transferred to the n registers in the second row from the leftmost column toward the rightmost column. In this way, the test data is serially transferred to the registers, and lastly, the test data is serially transferred to the n registers in the last (bottom) row from the leftmost column toward the rightmost column.

Once the test data (TDI) is set in all registers, the multiplexer 82 selects a normal operation clock signal (CK) and supplies the selected clock signal as the control signal A to the register groups 81. In response to the control signal A, the m registers in each register group 81 serially supply the test data (TDI) to the corresponding pad 41.

In this way, the third embodiment employs a register circuit containing a matrix of n×m registers corresponding to the number of tests. Required test vectors are supplied to the pads 41 through the register circuit to carry out a test such as a defects analyzing test in synchronization with a normal operation clock signal (CK).

Fourth Embodiment

Figure 10:
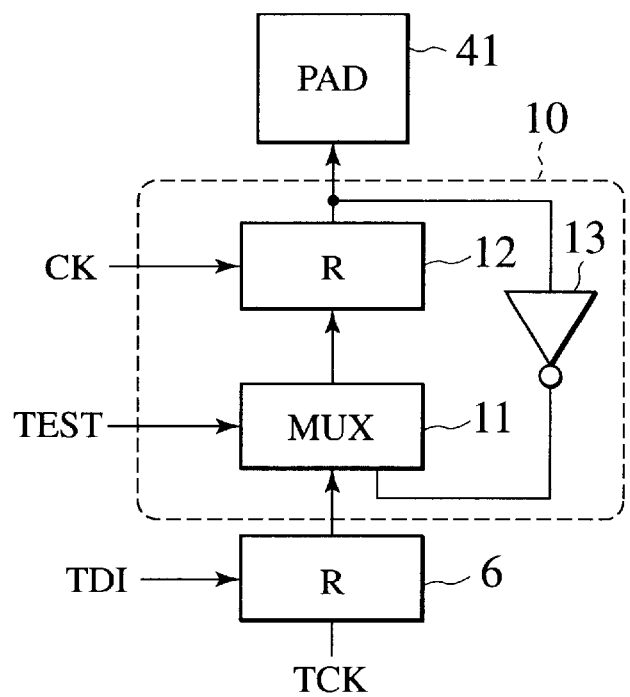
FIG. 10 is a block diagram showing a semiconductor device according to a fourth embodiment of the present invention.

FIG. 10 is a block diagram showing a semiconductor device according to the fourth embodiment of the present invention. The fourth embodiment solves the problem of the third embodiment that, as the number of test vectors increases, the number of registers in each register group 81 and the number of pads 41 that need the register groups 81 must be increased.

FIG. 10 specifically shows the structure of a test vector generator 10 according to the fourth embodiment. The test vector generator 10 is arranged between a register 6 and a pad 41 that needs test vectors. The test vector generator 10 has a multiplexer (MUX) 11 operating in synchronization with a test clock signal (TCK), a register 12 operating in synchronization with a normal operation clock signal (CK), and an inverter 13 for inverting the output of the register 12 and supplying the inverted output to the multiplexer 11.

To set initial test data (TDI), an external tester (not shown) supplies the test data to the register 6. In response to a control signal TEST, the multiplexer 11 selectively receives the test data from the register 6. In synchronization with the normal operation clock signal (CK), the register 12 receives the test data from the multiplexer 11 and supplies it to the pad 41. Then, the multiplexer 11 selects the output of the inverter 13 and supplies the output to the register 12. As a result, the pad 41 receives test vectors defined by two test data pieces supplied in synchronization with the normal operation clock signal (CK), to execute a test such as a defects analyzing test in synchronization with a chip cycle time defined by the normal operation clock signal (CK). Instead of the test vector generator 10 of FIG. 10, a test vector generator 14 of FIG. 11 may be used.

Figure 11:
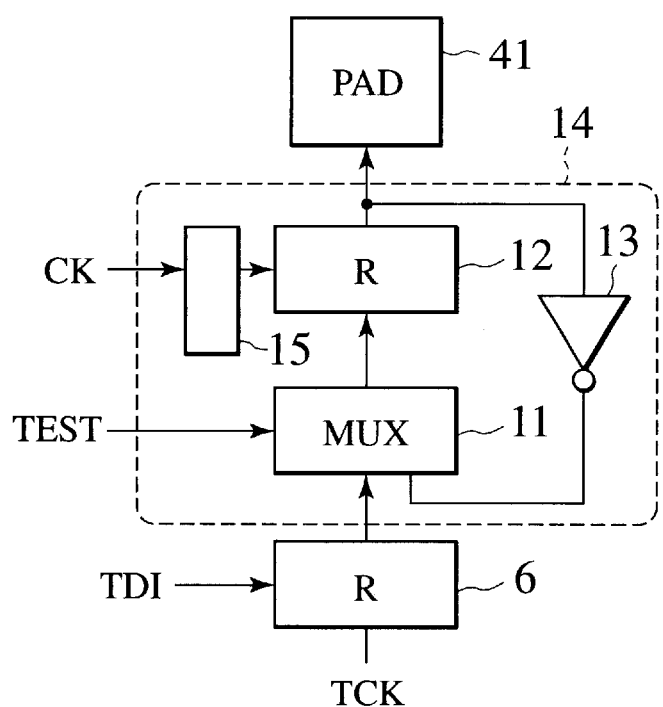
FIG. 11 is a block diagram showing a test vector generator applicable to the device of FIG. 10.

The test vector generator 14 of FIG. 11 has a frequency divider 15 in the middle of a line for supplying a normal operation clock signal (CK) to a register 12. This arrangement multiplies the clock signal (CK) and provides a multiplied clock signal to operate the register 12. This arrangement is capable of supplying test vector of various frequencies to a pad 41, to increase the degree of freedom of test data (TDI).

Instead of the register circuit of FIG. 9, the test vector generator 10 of FIG. 10 or the test vector generator 14 of FIG. 11 is employable to greatly reduce a layout area or a chip area.

Fifth Embodiment

Figure 12:
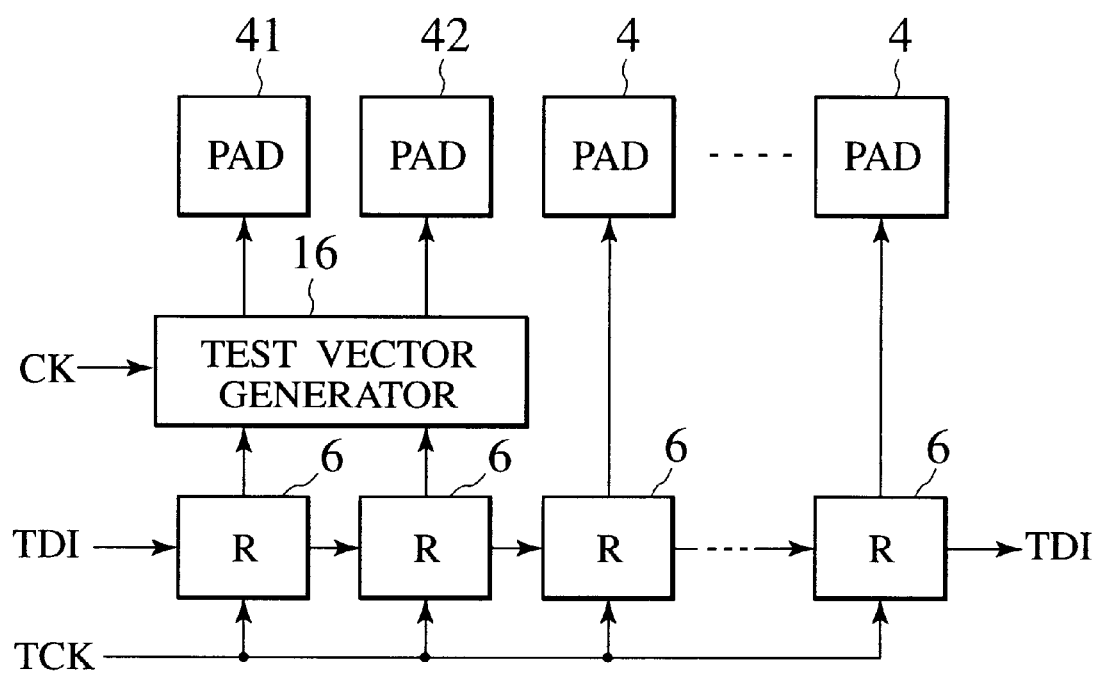
FIG. 12 is a block diagram showing a semiconductor device according to a fifth embodiment of the present invention.

FIG. 12 is a block diagram showing a semiconductor device according to the fifth embodiment of the present invention. Unlike the second, third, and fourth embodiments of FIGS. 8 to 11 that provide each pad 41 with a test vector generator, the fifth embodiment provides two or more pads with a test vector generator.

In FIG. 12, two pads 41 and 42 are provided with a test vector generator 16. The test vector generator 16 receives two test data pieces (TDI) from registers 6, generates test vectors, and supplies the test vectors to the pads 41 and 42. For example, this arrangement is applicable to supply address counts as test data to the pads 41 and 42. In this case, the test vector generator 16 may have a counter to count a plurality of test data pieces supplied thereto and supply resultant counts as test data to the pads 41 and 42.

In summary, the present invention provides a semiconductor device capable of easily accepting manual needles and bonding wires to execute a test such as a defects analyzing test with, for example, a probe card.

The present invention also provides a semiconductor device capable of setting test vectors and carrying out a test such as a defects analyzing test on internal circuits such as logic circuits of the semiconductor device with use of a boundary scan test circuit and test vector generator in synchronization with a cycle time defined by a normal operation clock signal (CK).

Various modifications will become possible for those skilled in the art after receiving the teachings of the present disclosure without departing from the scope thereof.

What is claimed is:

1. A semiconductor device comprising:
   a plurality of input/output pads arranged in a middle part of the semiconductor device;
   a plurality of registers provided for the input/output pads, respectively, and connected to one another in series to form a serial scan chain;
   a first pad arranged at the periphery of the semiconductor device and connected to a first one of the registers formed the serial scan chain, the first pad configured to receive externally supplied test data and supply the test data to the registers;
   a second pad arranged at the periphery of the semiconductor device and connected to a last one of the registers formed the serial scan chain; and
   a third pad arranged at the periphery of the semiconductor device, the third pad configured to supply an externally supplied first clock signal to the registers.

2. The semiconductor device as claimed in claim 1, further comprising:
   a fourth pad arranged at the periphery of the semiconductor device, the fourth pad configured to receive externally supplied test data and directly supply the test data to a predetermined internal circuit by bypassing the registers.

3. The semiconductor device as claimed in claim 1, further comprising:
   at least one fourth pad arranged in a central part of the semiconductor device, the fourth pad configured to receive externally supplied test data and directly supply the test data to a predetermined internal circuit by bypassing the registers, a gap between the fourth pad and any adjacent one of the input/output pads being wider than a gap between adjacent ones of the input/output pads.

4. The semiconductor device as claimed in claim 3, wherein:
   a plurality of the fourth pads are arranged such that a gap between adjacent ones of the fourth pads is wider than a gap between adjacent ones of the input/output pads.

5. The semiconductor device as claimed in claim 3, wherein:
   a plurality of the fourth pads are arranged such that they are not adjacent to one another.

6. The semiconductor device as claimed in claim 1, further comprising:
   a fifth pad arranged at the periphery of the semiconductor device, the fifth pad configured to supply source power to the semiconductor device.

7. The semiconductor device as claimed in claim 6, wherein:
   a gap between the fifth pad and any adjacent one of the first to third pads is wider than a gap between adjacent ones of the input/output pads.

8. The semiconductor device as claimed in claim 1, further comprising;
   at least one fifth pad arranged in a central part of the semiconductor device, the fifth pad configured to supply source power to the semiconductor device.

9. The semiconductor device as claimed in claim 8, wherein:
   a gap between the fifth pad and any adjacent one of the input/output pads is wider than a gap between adjacent ones of the input/output pads.

10. The semiconductor device as claimed in claim 8, wherein:
    a plurality of the fifth pads are arranged at ends of the central part such that they are not adjacent to one another.

11. The semiconductor device as claimed in claim 1, wherein:
    the registers are test data handling registers in a JTAG boundary scan test circuit.

12. The semiconductor device as claimed in claim 1, wherein:
    the first pad is a test data input pad according to JTAG specifications;
    the second pad is a test data output pad according to the JTAG specifications; and
    the third pad is a test clock signal input pad according to the JTAG specifications.

13. A semiconductor device comprising:
    a plurality of registers connected in series to form a boundary scan circuit and transfer and store test data in synchronization with a first clock signal;
    a plurality of pads provided for the registers, respectively, the pads configured to receive test data from the registers and supply the test data to corresponding internal circuits; and
    a test vector generator arranged between any one of the pads that is supplied a plurality of test vectors and the corresponding register, the test vector generator configured to generate, according to test data supplied from the corresponding register, test vectors in synchronization with a second clock signal, which is faster cycle time than the first clock signal and defines a normal cycle time of the semiconductor device, and supply the generated test vectors to the corresponding pad.

14. The semiconductor device as claimed in claim 13, wherein the test vector generator includes:
    a plurality of register groups including "n×m" registers, where "n" being a positive integer, "m" being a positive integer;
    a first multiplexer configured to provide one of the first clock signal and the second clock signal according to a control signal; and
    second multiplexers provided for the registers, respectively, the second multiplexers configured to receive test data and supply the test data to the registers according to the control signal,
    the m registers in each column of the register circuit serially transferring the test data to the corresponding pad in synchronization with the second clock signal when the first multiplexer selects and provides the second clock signal.

15. The semiconductor device as claimed in claim 13, wherein the test vector generator includes:

a multiplexer configured to receive test data from the corresponding register in synchronization with the first clock signal;

a first register configured to receive the test data from the multiplexer, store the received test data, and supply the stored test data to the corresponding pad, in synchronization with the second clock signal; and an inverter configured to invert the output of the first register and supply the inverted output to the first register through the multiplexer.

16. The semiconductor device as claimed in claim 15, wherein the test vector generator further includes:

a frequency divider configured to divide the frequency of the second clock signal by a predetermined number, supplying the frequency-divided second clock signal to the first register, which operates in synchronization with the frequency-divided second clock signal.

17. The semiconductor device as claimed in claim 13, wherein the test vector generator is shared by at least two pads.

18. The semiconductor device as claimed in claim 17, wherein the test vector generator includes a counter circuit.

\* \* \* \* \*